(12) United States Patent
Kim et al.

(10) Patent No.: US 7,537,952 B2
(45) Date of Patent: May 26, 2009

(54) METHOD OF MANUFACTURING MEMS DEVICE PACKAGE

(75) Inventors: Jong-seok Kim, Hwasung-si (KR); Yun-kwon Park, Dongducheon-si (KR); In-sang Song, Seoul (KR); Duck-hwan Kim, Goyang-si (KR); Kuang-woo Nam, Yongin-si (KR); Seok-chul Yun, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 11/802,231

(22) Filed: May 21, 2007

(65) Prior Publication Data
US 2007/0224719 A1    Sep. 27, 2007

Related U.S. Application Data

(62) Division of application No. 11/260,090, filed on Oct. 28, 2005.

(30) Foreign Application Priority Data
Dec. 27, 2004    (KR) .............................. 2004-112700

(51) Int. Cl.
*H01L 21/00*    (2006.01)
(52) U.S. Cl. .............................. 438/48; 438/50; 438/52
(58) Field of Classification Search ................... 538/51; 438/48, 50, 52
See application file for complete search history.

(56) References Cited

U.S. PATENT DOCUMENTS

| 6,884,650 | B2 | 4/2005 | Lee et al. |
| 2005/0017313 | A1* | 1/2005 | Wan ........................... 257/415 |
| 2006/0109069 | A1 | 5/2006 | Chou |

* cited by examiner

*Primary Examiner*—Brook Kebede
*Assistant Examiner*—Tony Tran
(74) *Attorney, Agent, or Firm*—Sughrue Mion, PLLC

(57) ABSTRACT

A micro electromechanical system (MEMS) device package and a method of manufacturing the same are provided. The MEMS device package includes: a device substrate with a MEMS active device being formed on the top surface thereof; internal electrode pads, each of which is positioned on the opposite side of the MEMS active device and electrically connected to the MEMS active device; sealing pads positioned outside of the internal electrode pads; a closure substrate joined to the device substrate through the sealing pads, the closure substrate having via holes formed at the areas where the internal electrode pads are positioned; and external electrode pads formed on the top surface of the closure substrate in such a way that the external electrode pads are electrically connected to the internal electrode pads through the via holes. The internal electrode pads and the sealing pads are formed from an identical material such as Au and thus the device substrate and the closure substrate are bonded to each other with direct bonding such as Au—Au direct bonding via the sealing pads.

10 Claims, 3 Drawing Sheets

METHOD OF MANUFACTURING MEMS DEVICE PACKAGE

CROSS-REFERENCE TO RELATED APPLICATIONS

This is a divisional of application Ser. No. 11/260,090 filed Oct. 28, 2005. The entire disclosure of the prior application, application Ser. No. 11/260,090 is considered part of the disclosure of the accompanying divisional application and is hereby incorporated by reference.

This application claims priority from Korean Patent Application No. 2004-112700 filed Dec. 27, 2004 in the Korean Intellectual Property Office, the disclosure of which is incorporated herein by reference.

BACKGROUND OF THE INVENTION

1. Field of the Invention

Apparatuses and methods consistent with the present invention relate to a micro electromechanical system (MEMS) device package and a method for manufacturing the same.

2. Description of the Related Art

MEMS is the integration of sensors, micro actuators, gyroscopes, precise machine parts, etc. using semiconductor processing technology. As a high level of precision, product uniformity, and superior productivity required for semiconductor processing are applied to MEMS, MEMS is recognized as a technology capable of improving performances of products while reducing costs.

MEMS devices such as acceleration sensors, angular velocity sensors, resonant gyroscopes, or the like are packaged for the purpose of enhancing protectability and/or sensitivity thereof. As high density and miniaturization of MEMS devices have been realized due to the rapid development of technologies for manufacturing MEMS devices, it is also required for packages to be correspondingly miniaturized. For this purpose, Wafer Scale Package (WSP) application for packaging devices in a wafer state is frequently attempted.

FIG. 1 is a cross-sectional view schematically showing an example of a conventional MEMS device package. As shown in the drawing, a device substrate 1 is provided with a MEMS active device 2, and a glass closure substrate 3 is joined to the device substrate 1 for protecting the MEMS active device 2. The MEMS active device 2 typically has a spring structure and a stage supported by the spring structure.

In addition, internal electrode pads 5 are formed on the device substrate 1, wherein each of the internal electrode pads is positioned on the opposite side of the MEMS active device 2 and electrically connected to the MEMS active device 2. A cavity 4 is formed under the glass closure substrate 3 for providing a space for receiving the MEMS active device 2, wherein the glass closure substrate 3 and the device substrate 1 are anodic-bonded to each other.

In addition, via holes 6 are formed on the opposite sides of the glass closure substrate 3, and external electrode pads 7, which are connected to the internal electrode pads 5, are formed through the via holes 6. Here, the via holes 6 are formed through a sandblasting process, and the external electrodes 7 are formed by filling a metallic material (typically Al) in the via holes 6 through a sputtering process. The external electrode pads 7 are connected to a signal line on a circuit board not shown in the figure through a wire, a bump or the like.

However, a conventional MEMS device package as described above inevitably has a thick glass closure substrate 3 due to the bonding structure between the glass closure substrate 3 and a silicon-based device substrate 1 and the manufacturing process of the MEMS device package, whereby there is a limit in reducing the size of the package due to the via holes 6 in the glass substrate 3. In other words, due to a large size and a high height, such a conventional MEMS package occupies a large volume in an apparatus incorporating it, thereby causing the miniaturization of the apparatus to be hindered.

Furthermore, because such a conventional MEMS package employs a closure substrate 3 formed from glass, the processes for forming the via holes 6 and the external electrode pads 7 are difficult to perform and require much time, thereby causing a decrease in yield and productivity.

Such a conventional MEMS package also has a problem in that the MEMS active device 2 may be deformed or damaged due to high temperature (typically about 460° C.) at the time of anodic-bonding and has basic stress due to the difference in thermal expansion coefficient between the glass closure substrate 3 and the silicon-based device substrate 1.

Moreover, a problem of reliability may be presented because the connection of a circuit by means of the internal electrode pads 5 formed from a silicon material and the external electrode pads 7 formed from a metallic material produces a very high inductance in relation to RF signals of high frequency and electrical contact resistance at the contact parts, thereby causing a high loss in signal.

SUMMARY OF THE INVENTION

Accordingly, an illustrative, non-limiting embodiment of the present invention has been made to solve the above-mentioned problems, and an aspect of the present invention is to provide a MEMS device package, in which a closure substrate formed from a material identical to that of a device substrate is employed so as to reduce the stress caused by a difference in thermal expansion coefficient, and in which via holes for wiring of electrodes can be simply fabricated and a simple metal deposition process can be employed, so that the MEMS device package can be minimized in size, and a method of manufacturing such a MEMS device package.

Another aspect of the present invention is to provide a MEMS device package, in which a device substrate and a closure substrate are bonded to each other with direct bonding, such as Au—Au direct bonding, which uses a material identical to the material forming the internal electrode pads and the sealing pads of the MEMS device package, so that the package is stable and capable of enhancing a yield, and a method of manufacturing such a MEMS device package.

A still further aspect of the present invention is to provide a MEMS device package, in which a circuit connection structure is formed by contacting members formed from a same or highly conductive material so as to minimize the loss in signal, and a method of making such a MEMS device package.

In order to achieve the above-mentioned aspects, there is provided a MEMS device package which includes: a device substrate with a MEMS active device being formed on the top surface thereof; internal electrode pads, each of which is positioned on the opposite side of the MEMS active device and electrically connected to the MEMS active device; sealing pads positioned outside of the internal electrode pads; a closure substrate joined to the device substrate through the sealing pads, the closure substrate having via holes formed at the areas where the internal electrode pads are positioned; and external electrode pads formed on the top surface of the closure substrate in such a way that the external electrode pads are electrically connected to the internal electrode pads through the via holes.

The internal electrode pads and the sealing pads may be formed from an identical material such as Au, and the device substrate and the closure substrate may be bonded to each other with direct bonding such as Au—Au direct bonding. In addition, the external electrodes may also be formed from a material identical to the material forming the internal electrode pads and the sealing pads.

According to another aspect of the present invention, there is provided a method of manufacturing a MEMS device package. The method may include following steps: a) providing a device substrate having a MEMS active device and one or more lead lines electrically connected with the active device; b) forming, on a closure substrate, internal electrode pads and sealing pads positioned outside of the internal electrode pads to a predetermined height; c) bonding the device substrate and the closure substrate to each other through the sealing pads in such a way that the MEMS active device is positioned in a space provided by the internal electrode pads and the internal electrode pads come into contact with the lead lines; d) polishing the closure substrate to a predetermined thickness; e) forming via holes at the positions where the internal electrode pads are positioned on the closure substrate; and f) forming external electrode pads which are electrically connected with the internal electrode pads through the via holes.

The step b) of the above method may include sub-steps of: b1) coating a seed layer on the entire surface of the closure substrate; b2) forming a plating frame for use in forming the internal electrode pads and the sealing pads on the seed layer through a photolithography process; b3) electrically plating a material such as Au which is identical to the material forming the seed layer on the closure substrate, over the plating frame; and b4) removing the plating frame.

In the above step b1), Au, as a material to form the seed layer, may be coated to a thickness of about 1,000 Å.

In addition, in the step c) of the above method, the bonding of the device substrate and the closure substrate to each other through the sealing pads may employ direct bonding using a material which is identical to the material forming the internal electrode pads and the sealing pads. For such direct bonding, Au—Au direct bonding may be performed at a temperature of 320±10° C. within about 20 minutes.

The thickness of the closure substrate used in the step d) of the above method may be about 40 μm.

In the step e) of the above method, in order to form the via holes, the closure substrate may be etched using Inductively Coupled Plasma (ICP).

In the step f) of the above method, to form external electrode pads on the closure substrate, a material, such as Au, identical to the material which forms the internal electrode pads and the sealing pads may be sputtered.

BRIEF DESCRIPTION OF THE DRAWINGS

The above aspects and features of the present invention will be more apparent from the description for exemplary embodiments of the present invention taken with reference to the accompanying drawings, in which.

DETAILED DESCRIPTION OF THE EXEMPLARY EMBODIMENTS

Hereinbelow, an exemplary embodiment of the present invention is described in detail with reference to accompanying drawings.

Figure 1:
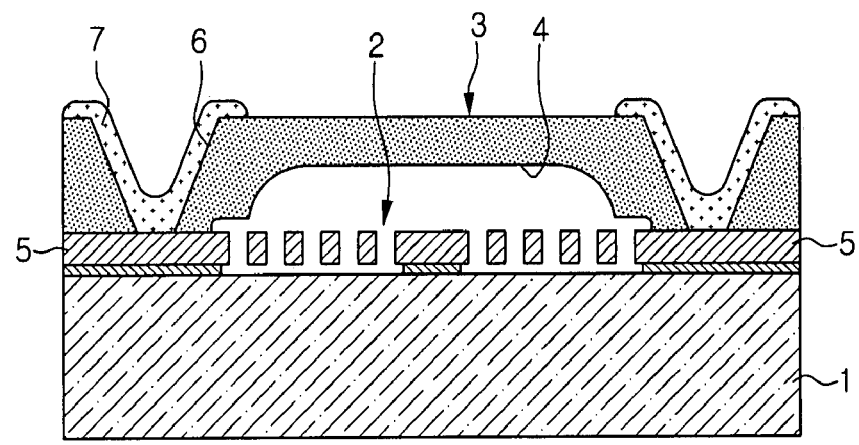
FIG. 1 is a schematic structural view of a conventional MEMS device package.
Figure 2:
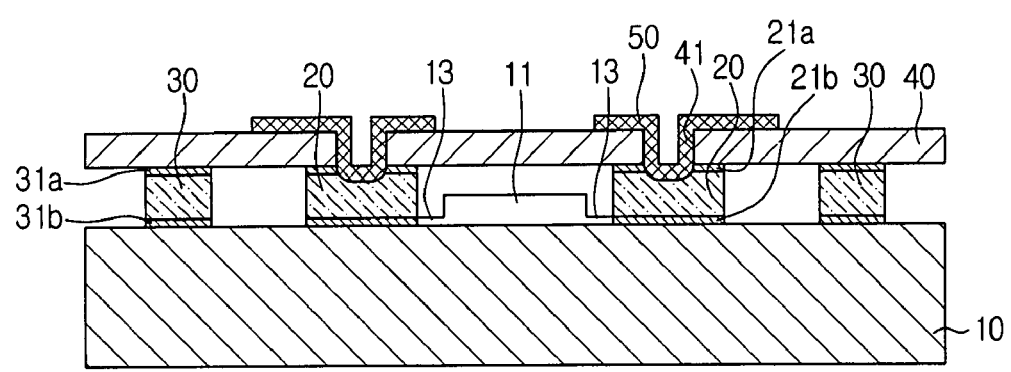
FIG. 2 is a schematic structural view of a MEMS device package according to an exemplary embodiment of the present invention.

FIG. 2 is a schematic structural view of a MEMS device package according to an exemplary embodiment of the present invention. As shown in the drawing, a MEMS active device 11 is formed on the central part of the top surface of a device substrate 10. The MEMS active device 11 typically comprises a spring element, a stage supported by the spring element and electrodes for detecting the displacement of the stage or supplying a driving force for the stage. Such a MEMS active device 11 does not limit the technical scope of the present invention. In addition, lead lines 13 electrically connected to the MEMS active device 11 are formed on the device substrate 10.

Internal electrode pads 20 having a predetermined height are placed on the device substrate 10, wherein each of the internal electrode pads 20 is positioned on the opposite side of the MEMS active device 11 in order to provide a space for positioning the MEMS active device and connected with the lead lines 13 to form an electric path for the MEMS active device. The internal electrode pads 20 are formed from Au.

At the outside of the internal electrode pads 20, there are provided sealing pads 30 formed from Au like the internal electrode pads 20 to a height equal to that of the internal electrode pads 20.

A closure substrate 40 is joined to the device substrate 10 via the sealing pads 30. The top and bottom surfaces of the internal electrode pads 20 and the sealing pads 30, i.e., the interfaces thereof with the device substrate 10 and the closure substrate 40, are formed with Au layers 21a, 21b, 31a and 31b having a thickness of about 1,000 Å, respectively.

Therefore, because the device substrate 10 and the closure substrate 40 are bonded to each other with Au—Au direct bonding, it is possible to bond them within a shorter length of time and at a lower temperature as compared to the anodic bonding of a glass substrate and a silicon substrate in the prior art. The above-mentioned temperature is about 320° C. and the above-mentioned bonding time is about 20 minutes. This means that it is possible to greatly reduce the deformation and damage of a device as compared to the prior art. In addition, the present invention can avoid the stress problem caused by the difference in thermal expansion coefficient in the prior art because the device substrate 10 and the closure substrate 40 are formed from an identical material.

Furthermore, via holes 41 are formed at the areas where the internal electrode pads 20 of the closure substrate 40 are formed to expose the internal electrode pads 20, wherein external electrode pads 50 are formed in the via holes 41 to be electrically connected to the internal electrode pads 20.

The via holes 41 are formed through Inductively Coupled Plasma (ICP) etching and the external electrode pads 50 are formed through sputtering, wherein, because the via holes 41 are formed in the thin substrate 40 rather than in a glass substrate, the via holes 41 can be formed through a simple etching process rather than a sandblasting process, and the sputtering process is also simple.

In addition, the external electrode pads 50 are formed from Au, which enables electric connection with the same and high conductive material. Such a circuit connection construction enables to lower a loss in signal because it has a lower contact resistance and a lower inductance with respect to RF signals of high frequency as compared to the conventional connection of silicon to aluminum.

In this manner, the inventive MEMS device package can be thinned and miniaturized by employing a thin closure substrate 40 and can reduce a loss in signal because it has an electric signal path, of which the internal resistance is retained at a lower level. Furthermore, because the external electrode pads 50 are formed on the surface of the closure substrate 40, the inventive MEMS device package can be mounted on a circuit board in a direct bonding fashion and plural packages can be easily stacked.

Now, a method of manufacturing the inventive MEMS device package is described in detail with reference to FIGS. 3A to 3G. Because conventional processes such as laminating, patterning, etc. are employed in the inventive method, the processing processes are not specifically described.

Figure 3A:
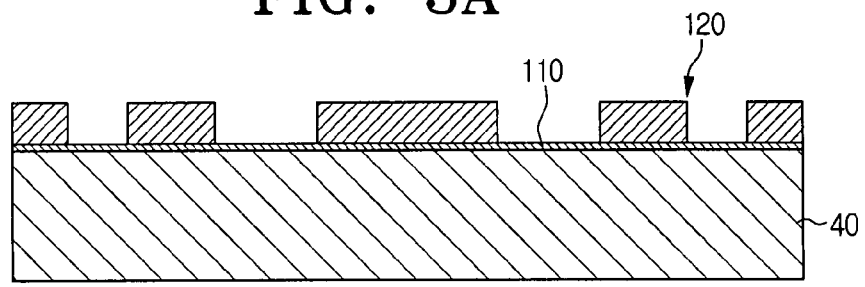
FIGS. 3A to 3G show a process of manufacturing the MEMS device according to an exemplary embodiment of the present invention.

At first, as shown in FIG. 3A, Au is coated on the entire surface of a closure substrate with a thickness of about 1,000 Å to form a seed metal layer 110, and a plating frame 120 is formed on the seed metal layer through a photolithographic process or the like. The plating frame 120 is used for forming internal electrode pads 20 and sealing pads 30.

Figure 3B:
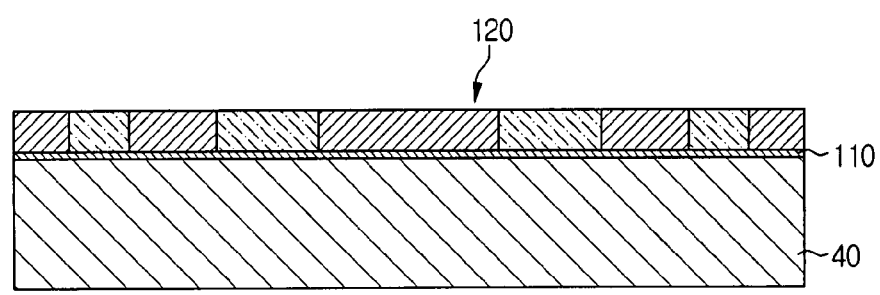

Then, as shown in FIG. 3B, Au is electrically plated through the plating frame 120, then the plating frame 120 is removed, and then the exposed seed metal layer is removed.

Figure 3C:
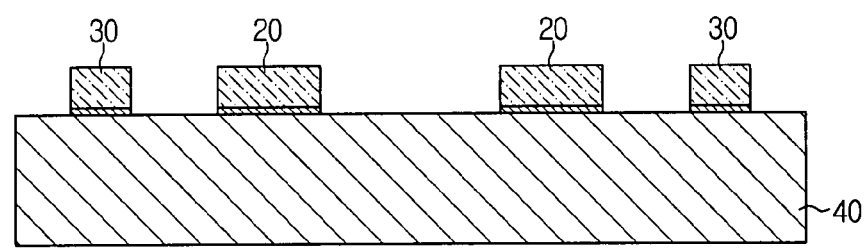

Through this process, as shown in FIG. 3C, a structure with the internal electrode pads 20 and the sealing pads 30 formed on the inner side of the closure substrate 40 is prepared.

Figure 3D:
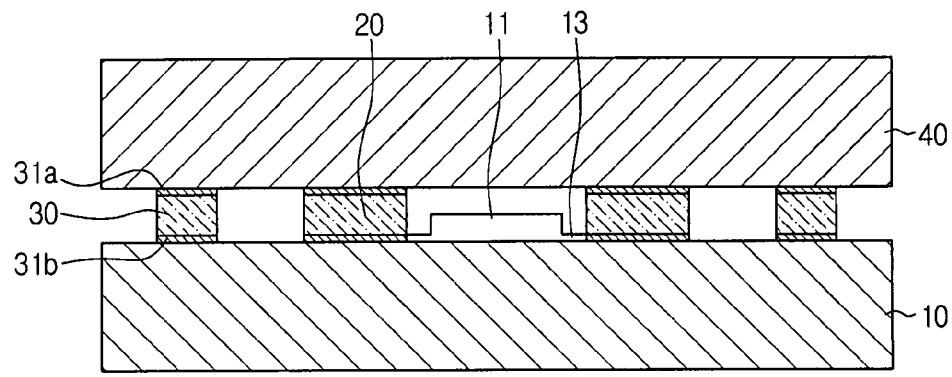
Figure 3E:
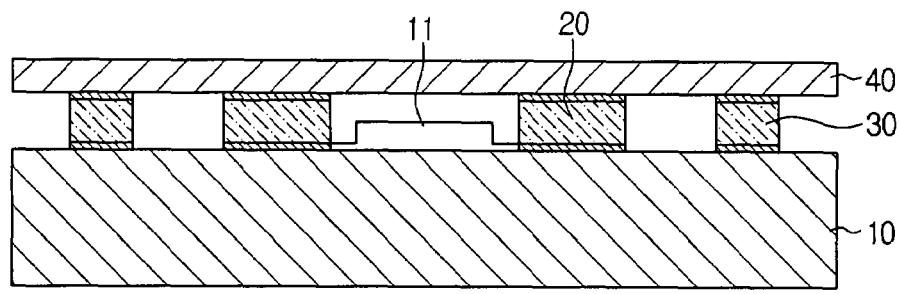

Thereafter, as shown in FIG. 3D, a device substrate 10 having a previously prepared active device 11 and lead lines 13 is bonded to the closure substrate 40 using the sealing pads 30. At this time, the MEMS active device 11 is positioned within a space formed by the internal electrodes 20 and connected to the lead lines 13.

Because the above-mentioned bonding is Au—Au direct bonding between the sealing pads 30 formed from Au and an Au layer 31b formed on the device substrate 10, it is possible to lower the bonding temperature and reduce the length of bonding time as compared to the conventional anodic bonding. The bonding temperature is about 320° C. and the length of bonding time may be around 20 minutes. Therefore, the possibility of deforming or damaging the device at the time of bonding can be reduced as compared to the prior art.

In addition, because the substrates of a same material and hence a same thermal expansion coefficient are bonded to each other unlike the conventional glass substrate to silicon substrate bonding, it is possible to avoid the occurrence of stress caused due to the difference in thermal expansion coefficient, thereby providing a more reliable MEMS device package.

After the device substrate 10 and the closure substrate 40 have been bonded to each other as described above, as shown in FIG. 3E, the closure substrate 40 is polished to a predetermined thickness, which is about 40 μm. The polishing is performed according to a conventional process which is implemented by grinding, lapping and chemical mechanical polishing in this sequence.

Figure 3F:
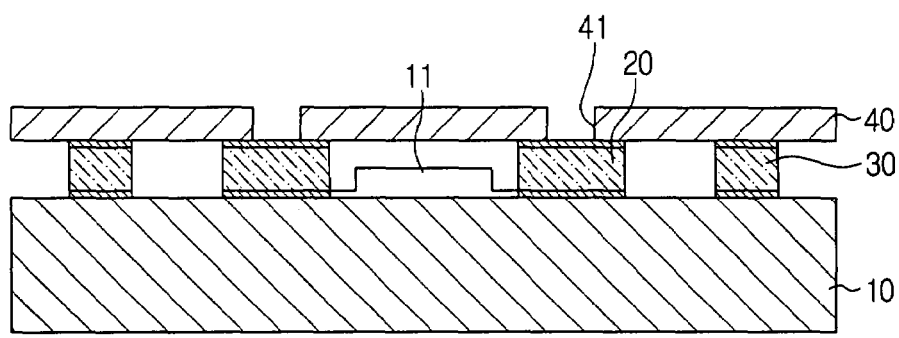

Then, as shown in FIG. 3F, via holes 41 for wiring of the electrodes are formed on predetermined positions, i.e., on the areas where the internal electrode pads 20 are positioned on the closure substrate polished to the predetermined thickness. Because the via holes 41 are formed through a thin silicon substrate rather than a glass substrate, it is possible to form them using a simple ICP-etching process rather than a difficult sandblasting process in the prior art.

Figure 3G:
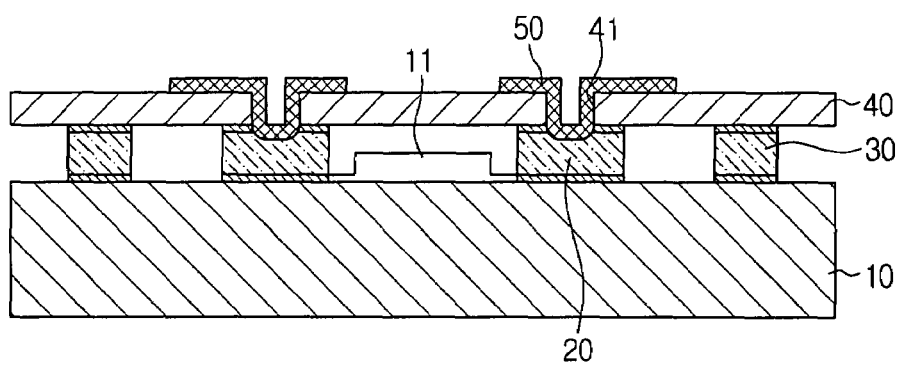

Then, Au is filled in the via holes 41 through a sputtering process, so that external electrode pads are formed to be electrically connected with the internal extrude pads 20 through the via holes 41 as shown in FIG. 3G. At this time, it is also possible to reduce the sputtering time because the thickness of the closure substrate 40 is thin.

As described above, because it is possible to provide a light, thin and miniaturized package according to the present invention, an apparatus, to which this package is applied, can be also miniaturized.

In addition, because it is possible to provide a package stable and highly reliable in function, the improvement in reliability and quality of an apparatus which employs the package can be realized.

Moreover, because a package can be manufactured with a stable and simple process, it is possible to improve yield and to save costs.

Although an exemplary embodiment of the present invention has been shown and described in order to exemplify the principle of the present invention, the present invention is not limited to the specific exemplary embodiment. It will be understood that various modifications and changes can be made by one skilled in the art without departing from the spirit and scope of the invention as defined by the appended claims. For example, the present invention can be applied to a package for a highly integrated device beyond a MEMS device. Therefore, it shall be considered that such modifications, changes and equivalents thereof are all included within the scope of the present invention.

What is claimed is:

1. A method of manufacturing a micro electro-mechanical system (MEMS) device package, the method comprising:
   a) providing a device substrate having a MEMS active device and one or more lead lines electrically connected with the MEMS active device;
   b) forming, on a closure substrate, internal electrode pads and sealing pads positioned outside of the internal electrode pads to a predetermined height;
   c) bonding the device substrate and the closure substrate to each other through the sealing pads in such a way that the MEMS active device is positioned in the space provided by the internal electrode pads and the internal electrode pads come into contact with the lead lines;
   d) polishing the closure substrate to a predetermined thickness;
   e) forming via holes at the positions where the internal electrode pads are positioned on the closure substrate; and
   f) forming external electrode pads which are electrically connected with the internal electrode pads through the via holes,
   wherein the forming of internal electrode pads and sealing pads on a closure substrate comprises:
   b1) coating a seed layer on the entire surface of the closure substrate;
   b2) forming a plating frame for use in forming the internal electrode pads and the sealing pads on the seed layer through a photolithography process;
   b3) electrically plating a material, which is identical to the material forming the seed layer on the closure substrate, over the plating frame; and
   b4) removing the plating frame.

2. The method of claim 1 wherein a material used for the seed layer is Au.

3. The method of claim 2, wherein Au is coated to a thickness of about 1,000 Å.

4. The method of claim 1, wherein the bonding of the device substrate and the closure substrate to each other through the sealing pads employs direct bonding which uses a layer formed on the device substrate, the layer comprising a material identical to a material forming the internal electrode pads and the sealing pads.

5. The method of claim 4, wherein the identical material is Au.

6. The method of claim 5, wherein the direct bonding using Au is performed at a temperature of 320±10° C. within about 20 minutes.

7. The method of claim 1, wherein the thickness of the closure substrate in the step d) is about 40 μm.

8. The method of claim 1, wherein, to form via holes, the closure substrate is Inductively Coupled Plasma (ICP)-etched.

9. The method of claim 1, wherein the forming of external electrode pads comprises sputtering a material which is identical to the material forming the internal electrode pads and the sealing pads.

10. The method of claim 9, the material sputtered to form external electrode pads is Au.

* * * * *